US 6,586,325 B2

(12) United States Patent
Chou

(10) Patent No.: US 6,586,325 B2
(45) Date of Patent: Jul. 1, 2003

(54) PROCESS FOR MAKING AN ELECTRONIC DEVICE HAVING A MULTILEVEL STRUCTURE

(75) Inventor: Chung-Lin Chou, Taipei (TW)

(73) Assignee: Cosmos Vacuum Technology Corporation, Taipei (TW)

( * ) Notice: Subject to any disclaimer, the term of this patent is extended or adjusted under 35 U.S.C. 154(b) by 207 days.

(21) Appl. No.: 09/888,851

(22) Filed: Jun. 26, 2001

(65) Prior Publication Data

US 2002/0197845 A1 Dec. 26, 2002

(51) Int. Cl.[7] ............................................. H01L 21/4763
(52) U.S. Cl. ...................... 438/625; 438/623; 438/618; 438/30; 438/714
(58) Field of Search ............................... 438/625, 618, 438/688, 623, 714, 30, 788, 765

(56) References Cited

U.S. PATENT DOCUMENTS

| 3,935,083 A | * | 1/1976 | Tomozawa et al. ......... 205/190 |
| 3,988,214 A | * | 10/1976 | Tsunemitsu .................. 205/124 |
| 5,418,636 A | * | 5/1995 | Kawasaki ..................... 349/138 |
| 5,731,216 A | * | 3/1998 | Holmberg et al. ............ 438/30 |
| 5,866,195 A | * | 2/1999 | Lemelson et al. ............ 427/62 |

* cited by examiner

Primary Examiner—Matthew Smith
Assistant Examiner—Igwe U. Anya
(74) Attorney, Agent, or Firm—Weingarten, Schurgin, Gagnebin & Lebovici LLP

(57) ABSTRACT

A process includes the steps of selectively and non-porously anodizing a metal film on a substrate to form a dense non-porous oxide layer on a first exposed area of the metal film, and selectively and porously anodizing the metal film and the dense non-porous oxide layer to convert the dense non-porous oxide layer and the metal film at a second exposed area into a porous oxide layer.

6 Claims, 6 Drawing Sheets

PROCESS FOR MAKING AN ELECTRONIC DEVICE HAVING A MULTILEVEL STRUCTURE

BACKGROUND OF THE INVENTION

1. Field of the Invention

This invention relates to a process for making an electronic device, more particularly to a process for making an electronic device that has a multilevel interconnection structure.

2. Description of the Related Art

With the rapid technological advancement in electronic devices, miniaturization thereof has been a primary concern of manufacturers. It is desirable that the electronic devices are highly integrated and have a multilevel interconnection structure which normally includes a substrate and levels of isolated conductive paths and interconnections on the substrate.

Conventionally, the levels of the conductive paths and interconnections of the multilevel interconnection structure are formed by a process that involves selective photo-etching of a thin metal film formed by sputtering or vacuum deposition of metal over the substrate. However, the process as such is disadvantageous in that a certain degree of unevenness results for each level of the conductive paths and interconnections, and that the unevenness is aggravated as an increasing number of levels of the conductive paths and interconnections is formed.

U.S. Pat. No. 3,988,214 disclosed a method of manufacturing a semiconductor device. As illustrated in FIGS. 1A to 1E, the method involves the steps of depositing a conductive metal film 401 on a semiconductor substrate 101 (see FIG. 1A), selectively and porously anodizing the conductive metal film 401 to form a metal oxide porous layer 404 and to define conductive channels 201 which are isolated by the porous layer 404 in the metal film 401 (see FIG. 1B), barrier anodizing each conductive channel 201 to form a metal oxide non-porous layer 502 that encloses the conductive channel 201 (see FIG. 1C), and forming an opening 503 in the non-porous layer 502 so as to expose a portion of the conductive channel 201 from the non-porous layer 502 to permit external connection (see FIG. 1D). In an alternative way, the conductive channel 201 in FIG. 1B is selectively barrier anodized such that the non-porous layer 502 only covers a portion of an upper surface of the conductive channel 201. The remaining portion of the upper surface of the conductive channel 201 is used to establish an external connection (see FIG. 1E).

Although the method proposed in the patent can alleviate the aforesaid unevenness problem, there is still a certain degree of unevenness between the porous layer 404 and the non-porous layer 502 due to a greater bulk volume change for the porous layer 404 than that for the non-porous layer 502 during the anodization of the metal film 401 or the conductive channel 201, and a need to further improve the evenness of each wiring level of the semiconductor device.

U.S. Pat. No. 5,580,825 disclosed a process for forming a multilevel electronic interconnect structure. As illustrated in FIGS. 2A to 2F, the process involves the steps of depositing a main aluminum layer 7 on a substrate 1 (see FIG. 2A) selectively barrier anodizing the main aluminum layer 7 to form a surface barrier oxide layer 72 (similar to the aforesaid non-porous layer 502 disclosed in U.S. Pat. No. 3,988,214) on the main aluminum layer 7 (see FIG. 2B) and to define first level conductive paths 2 in the main aluminum layer 7 underneath the surface barrier oxide layer 72 (see FIG. 2C), providing an upper aluminum layer 12 over the main aluminum layer 7 (see FIG. 2D), and selectively anodizing the main and the upper aluminum layers 7, 12 to form a porous layer 15 and to define contact pads 3, 5, and contact vias 6 (see FIGS. 2E and 2F) which are isolated by the porous layer 15.

The process suffers the same drawback that is associated with the aforementioned method disclosed in U.S. Pat. No. 3,988,214. Moreover, because the formation of the contact pads 3, which are to be respectively connected to the conductive paths 2, is carried out after the formation of the conductive paths 2, each of the contact pads 3 has a geometric dimension greater than that of the respective conductive path 2, thereby reducing the ability to accommodate a more complex and a higher density of the contact pads 3, 5, the conductive paths 2, and the contact vias 6 in the multilevel interconnection structure of the semiconductor device.

SUMMARY OF THE INVENTION

Therefore, the object of the present invention is to provide a process for making an electronic device that is capable of overcoming the aforementioned drawbacks.

According to the present invention, there is provided a process for making an electronic device. The process comprises the steps of: preparing a substrate having an insulative planar surface; forming a metal film over the planar surface of the substrate; selectively masking the metal film with a first mask to define an unexposed area and a first exposed area on the metal film; non-porously anodizing the metal film to form a dense non-porous oxide layer on the first exposed area of the metal film; removing the first mask from the metal film; selectively masking the metal film and the dense non-porous oxide layer with a second mask to define a second exposed area on the dense non-porous oxide layer, the second exposed area being offset from the unexposed area on the metal film; porously anodizing the metal film and the dense non-porous oxide layer to convert the dense non-porous oxide layer and the metal film at the second exposed area into a porous oxide layer; and removing the second mask from the metal film and the dense non-porous oxide layer.

BRIEF DESCRIPTION OF THE DRAWINGS

In drawings which illustrate an embodiment of the invention.

DETAILED DESCRIPTION OF THE PREFERRED EMBODIMENT

Figure 1A:
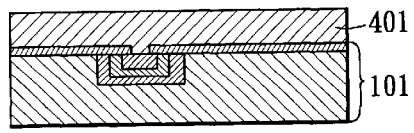
FIGS. 1A to 1E illustrate consecutive steps of a conventional process for the formation of an electronic device.
Figure 1B:
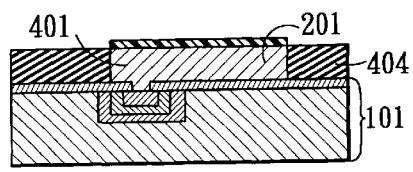
Figure 1C:
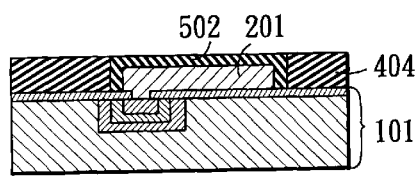
Figure 1D:
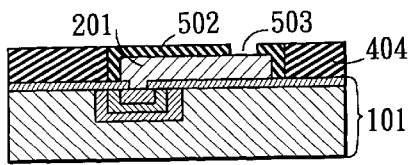
Figure 1E:
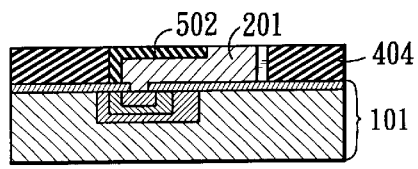
Figure 2A:
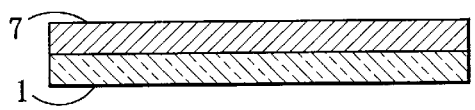
FIGS. 2A to 2F illustrate consecutive steps of another conventional process for the formation of a semiconductor device having a multilevel interconnection structure.
Figure 2B:
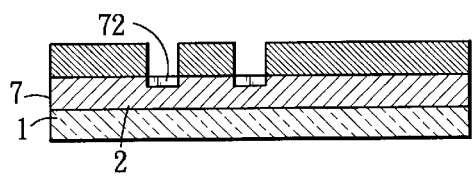
Figure 2C:
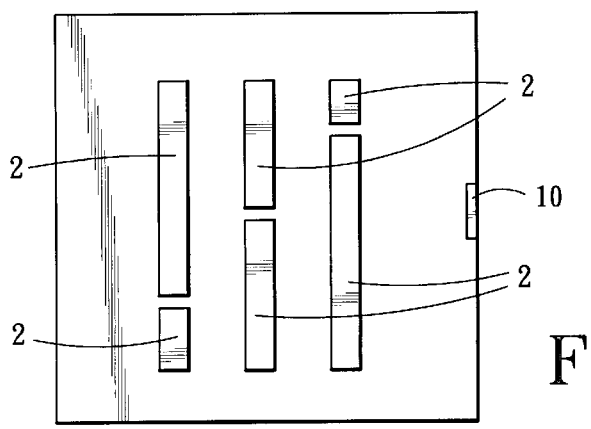
Figure 2D:
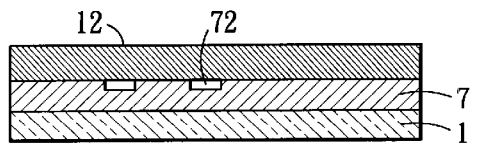
Figure 2E:
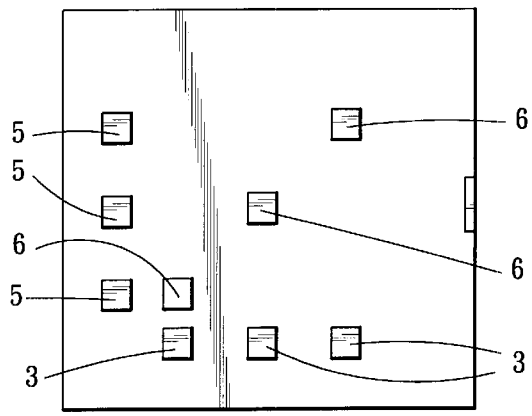
Figure 2F:
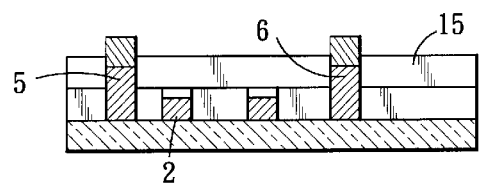
Figure 3:
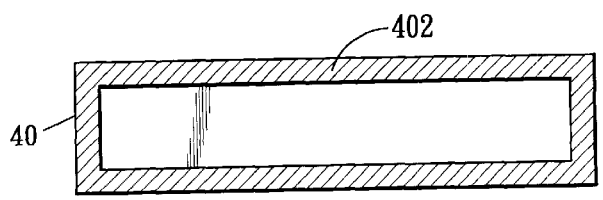
FIG. 3 illustrates the formation of a dense aluminum oxide surface on an aluminum substrate via anodizing techniques according to a process embodying this invention.
Figure 4:
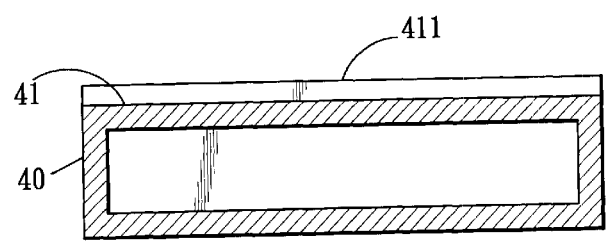
FIG. 4 illustrates the formation of a first metal film on the aluminum oxide surface according to the process embodying this invention.
Figure 5:
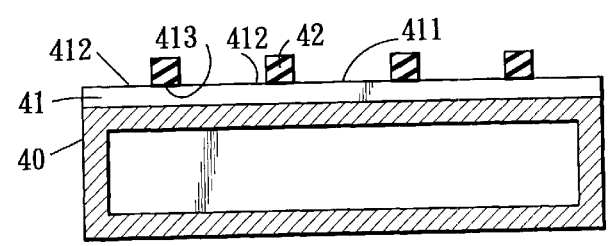
FIG. 5 illustrates the step of selectively photo-masking the first metal film to define first exposed and first unexposed areas on the first metal film according to the process embodying this invention.
Figure 6:
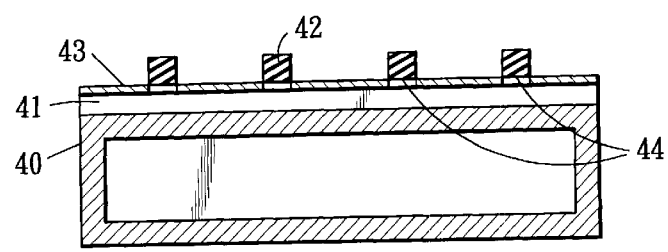
FIG. 6 illustrates the formation of a non-porous oxide layer on the first exposed area of the first metal film and the formation of a pattern of conductive surface contacts on the first unexposed areas of the first metal film according to the process embodying this invention.
Figure 7:
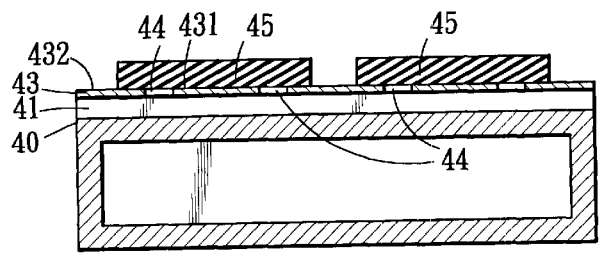
FIG. 7 illustrates the step of selectively photo-masking the non-porous oxide layer and the surface contacts to define second exposed and second unexposed areas on the non-porous oxide layer and the surface contacts according to the process embodying this invention.
Figure 8:
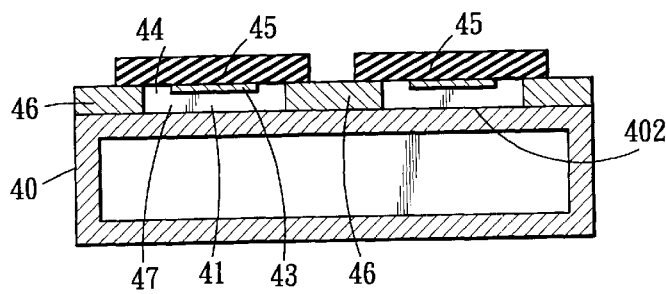
FIGS. 8 and 9 illustrate the formation of a first level porous oxide layer at the second exposed area and the formation of a pattern of first level conductive paths according to the process embodying this invention.
Figure 9:
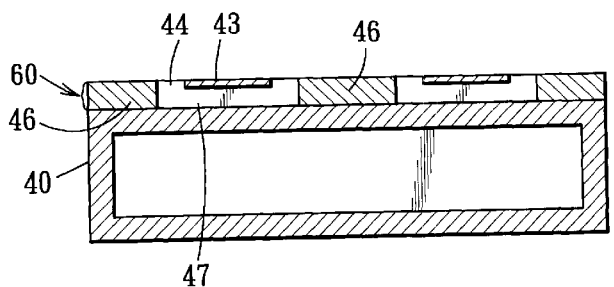
Figure 10:
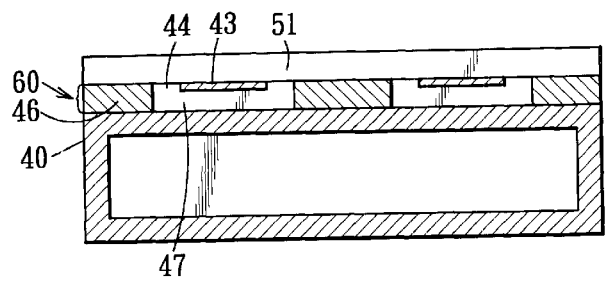
FIG. 10 illustrates the formation of a second metal film on the first level porous oxide layer, the non-porous oxide layer, and the surface contacts according to the process embodying this invention.
Figure 11:
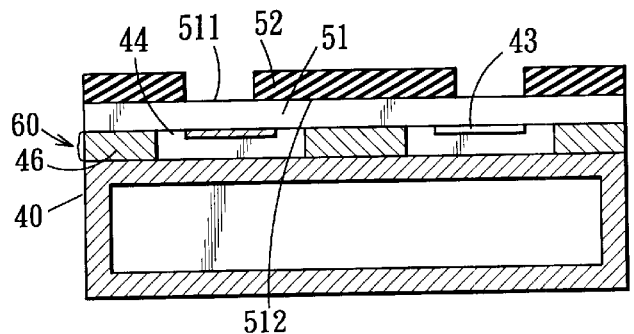
FIG. 11 illustrates the step of selectively photo-masking the second metal film to define third exposed and third unexposed areas on the second metal film according to the process embodying this invention.
Figure 12:
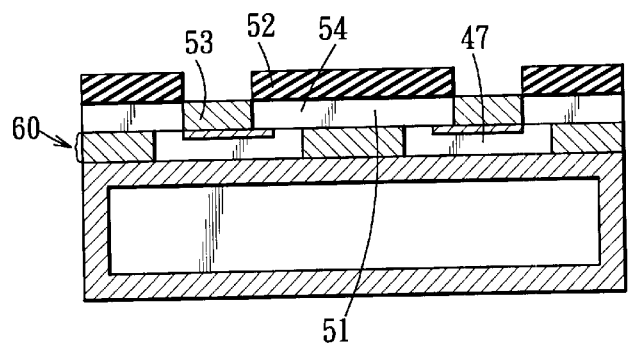
FIGS. 12 and 13 illustrate the formation of a second level porous oxide layer at the third exposed area and the formation of a pattern of second level conductive paths according to the process embodying this invention.
Figure 13:
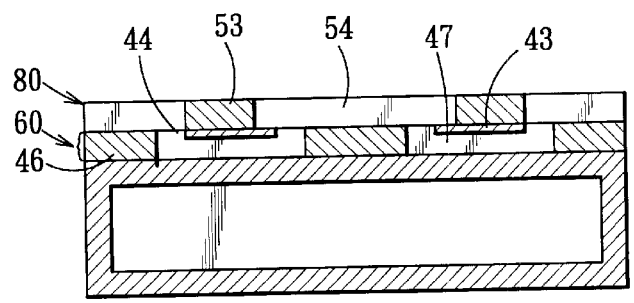

FIGS. 3 to 13 illustrate consecutive steps for forming a multilevel interconnection structure on a substrate 40 according to the process for making an electronic device of this invention.

The process includes the steps of: preparing the substrate 40 with an insulative planar surface 402; forming a first metal film 41 over the planar surface 402 of the substrate 40, the first metal film 41 having an upper surface 411; selectively photo-masking the first metal film 41 with a first mask 42 (photoresist) to define a first exposed area 412 and first unexposed areas 413 on the upper surface 411 of the first metal film 41, the first unexposed areas 413 being spaced apart by the first exposed area 412; non-porously anodizing the first metal film 41 to form a dense non-porous oxide layer 43 on the first exposed area 412 of the first metal film 41 and to define a pattern of conductive surface contacts 44 at the first unexposed areas 413 of the first metal film 41, the surface contacts 44 being spaced apart by the non-porous oxide layer 43; removing the first mask 42 from the surface contacts 44 of the first metal film 41 and the dense non-porous oxide layer 43; selectively masking the surface contacts 44 and the dense non-porous oxide layer 43 with a second mask 45 to define second unexposed areas 431, each of which at least covers a respective one of the surface contacts 441 and a second exposed area 432 on the dense non-porous oxide layer 437 the second exposed area 432 being offset from the surface contacts 44; porously anodizing the first metal film 41 and the dense non-porous oxide layer 43 to convert the dense non-porous oxide layer 43 and the first metal film 41 at the second exposed area 432 into a first level porous oxide layer 46 and to define a pattern of first level conductive paths 47 that are spaced apart by the first level porous oxide layer 46 and that respectively extend from the surface contacts 44 to the planar surface 402 of the substrate 40; removing the second mask 45 from the surface contacts 44 and the dense non-porous oxide layer 43, the first level conductive paths 47 cooperating with the first level porous oxide layer 46, the non-porous oxide layer 43, and the surface contacts 44 to form a first interconnection level 60 on the planar surface 402 of the substrate 40; forming a second metal film 51 over an upper surface of the first interconnection level 60; selectively photo-masking the second metal film 51 with a third mask 52 (photoresist) to define a third exposed area 511 and third unexposed areas 512 on an upper surface of the second metal film 51, the third unexposed areas 512 having portions that are respectively and vertically registered with the surface contacts 44; porously anodizing the second metal film 51 to convert the same at the third exposed area 511 into a second level porous oxide layer 53 and to define a pattern of second level conductive paths 54 that are spaced apart by the second level porous oxide layer 53 and that are respectively connected to and that extend from the surface contacts 44 to the upper surface of the second metal film 51; and removing the third mask 52 from the upper surface of the second metal film 51. The second level porous oxide layer 53 cooperates with the second level conductive paths 54 to form a second interconnection level 80 on the first interconnection level 60.

The substrate 40 is preferably made from an aluminum plate which is anodized to form an insulative aluminum oxide layer on an outer surface of the aluminum plate. The aluminum oxide layer of the aluminum plate is then polished to form the planar surface 402 of the substrate 40.

The first and second metal films 41, 51 preferably comprise a metal selected from a group consisting of aluminum, titanium, tantalum, niobium and hafnium. More preferably, the first and second metal films 41, 51 comprise aluminum and tantalum. Each of the first and second metal films 41, 51 can be formed by electron beam evaporation, and preferably has a thickness ranging from 1.0 to 2.5 $\mu$m when aluminum is employed.

The first mask 42 includes a pattern of a first photo-resist layer corresponding to the pattern of the surface contacts 44. Preferably, the first photo-resist layer has a thickness ranging from 1 to 8 $\mu$m.

The second mask 45 includes a pattern of a second photo-resist layer corresponding to the pattern of the first level contact paths 47. Preferably, the second photo-resist layer has a thickness ranging from 1 to 8 $\mu$m.

The third mask 52 includes a pattern of a third photo-resist layer corresponding to the pattern of the second level contact paths 54. Preferably, the third photo-resist layer has a thickness ranging from 1 to 8 $\mu$m.

The non-porously anodization of the first metal film 41 can be carried out in a 0.5 to 1% citric acid solution with a voltage of from 150 to 200 V.

The porously anodization of the first metal film 41 and the non-porous oxide layer 43 can be carried out in a 4% oxalate solution with a voltage less than 70 V.

By virtue of the dense non-porous oxide layer 43 formed on the first metal film 41 prior to the formation of the first level porous oxide layer 46, evenness of each interconnection level can be dramatically improved as compared to the prior art. Preferably, the non-porous oxide layer 43 has a thickness ranging from 0.1 to 0.5 $\mu$m to further ensure a high degree of evenness at the upper surface of the first interconnection level 60.

Moreover, since the surface contacts 44 are formed prior to the formation of the first level conductive paths 47, the geometric dimension of each one of the former is less than that of the respective one of the first level conductive paths 47, thereby increasing the ability to accommodate a more complex and a higher density of the surface contacts 44 and the first and second level conductive paths 47, 54 in the multilevel interconnection structure of the electronic device prepared according to the process of this invention.

With the invention thus explained, it is apparent that various modifications and variations can be made without departing from the spirit of the present invention. It is therefore intended that the invention be limited only as recited in the appended claims.

I claim:

1. A process for making an electronic device, the process comprising the steps of:

preparing a substrate having an insulative planar surface;

forming a metal film over said planar surface of said substrate;

selectively masking said metal film with a first mask to define an unexposed area and a first exposed area on said metal film;

non-porously anodizing said metal film to form a dense non-porous oxide layer on said first exposed area of said metal film;

removing said first mask from said metal film;

selectively masking said metal film and said dense non-porous oxide layer with a second mask to define a second exposed area on said dense non-porous oxide layer, said second exposed area being offset from said unexposed area on said metal film;

porously anodizing said metal film and said dense non-porous oxide layer to convert said dense non-porous oxide layer and said metal film at said second exposed area into a porous oxide layer; and removing said second mask from said metal film and said dense non-porous oxide layer.

2. The process of claim 1, wherein said metal film comprises a metal selected from the group consisting of aluminum, titanium, tantalum, niobium and hafnium.

3. The process of claim 1, wherein said metal film comprises aluminum and tantalum.

4. The process of claim 1, wherein said substrate is prepared by the steps of preparing an aluminum plate and forming said aluminum plate with an aluminum oxide layer that serves as said insulative planar surface.

5. The process of claim 1, wherein said metal film is made of aluminum, and has a thickness ranging from 1.0 to 2.5 $\mu$m, and said dense non-porous oxide layer has a thickness ranging from 0.1 to 0.5 $\mu$m.

6. A process for making an electronic device, the process comprising the steps of:

preparing a substrate having an insulative planar surface;

forming a metal film over said planar surface of said substrate, said metal film having an upper surface;

selectively masking said metal film with a first mask to define a first exposed area and first unexposed areas on said upper surface of said metal film, said first unexposed areas being spaced apart by said first exposed area;

non-porously anodizing said metal film to form a dense non-porous oxide layer on said first exposed area of said metal film and to define a pattern of conductive surface contacts at said first unexposed areas of said metal film, said surface contacts being spaced apart by said dense non-porous oxide layer;

removing said first mask from said surface contacts of said metal film;

selectively masking said surface contacts and said dense non-porous oxide layer with a second mask to define second unexposed areas, each of which at least covers a respective one of said surface contacts, and a second exposed area on said dense non-porous oxide layer, said second exposed area being offset from said surface contacts;

porously anodizing said metal film and said dense non-porous oxide layer to convert said dense non-porous oxide layer and said metal film at said second exposed area into a porous oxide layer and to define a pattern of conductive paths that are spaced apart by said porous oxide layer and that respectively extend from said surface contacts to said planar surface of said substrate; and removing said second mask from said surface contacts and said dense non-porous oxide layer.

* * * * *